United States Patent [19]
Yabe et al.

[11] Patent Number: 5,476,629
[45] Date of Patent: Dec. 19, 1995

[54] METHOD FOR MANUFACTURING IC CARD SUBSTRATE

[75] Inventors: Isao Yabe, Saitama; Kazuo Sato; Hajime Omata, both of Yamanashi, all of Japan

[73] Assignees: Citizen Watch Co. Ltd., Tokyo; Citizen Electronics Co., Ltd., Yamanashi, both of Japan

[21] Appl. No.: 171,711

[22] Filed: Dec. 21, 1993

[30]    Foreign Application Priority Data

Dec. 25, 1992 [JP] Japan .................................. 4-357937

[51] Int. Cl.⁶ .................................................. B29C 45/00
[52] U.S. Cl. ................................. 264/328.7; 264/328.12
[58] Field of Search ........................... 264/328.1, 328.7, 264/328.12, 328.8; 425/577

[56]            References Cited

U.S. PATENT DOCUMENTS 4,097,571   6/1978   Cox ........................................ 264/296
4,154,784   5/1979   Ruhl ....................................... 264/45.5
5,030,309   7/1991   Brignet et al. ......................... 156/245
5,149,479   9/1992   Nakajima ............................... 264/163

FOREIGN PATENT DOCUMENTS

WO92/20506  11/1992  WIPO .

Primary Examiner—Christopher A. Fiorilla
Attorney, Agent, or Firm—Townsend and Townsend and Crew

[57]            ABSTRACT

A method for manufacturing a substrate for an IC card in which, after a synthetic resin is filled into a cavity in an IC card substrate forming mold, or after a core pin for forming an IC module housing recessed section in the cavity in an IC card substrate forming mold is caused to project as far as an intermediate position, and the synthetic resin is filled into the cavity, the core pin is further caused to project to a specified position to form the IC module housing recessed section while the synthetic resin is in the mobile state.

12 Claims, 6 Drawing Sheets of the filled synthetic resin 26 is in the direction indicated by the arrow A. Specifically, the molecular orientation of the synthetic resin 26 is generated in the long direction of the IC card substrate 28. Therefore there is a tendency for warping of the IC card substrate 28 to occur easily in the long direction. There has been a drawback that the IC module housing recessed section 29 becomes deformed by this warping.

METHOD FOR MANUFACTURING IC CARD SUBSTRATE

BACKGROUND OF THE INVENTION

1. Field of the Invention

The present invention relates to a method for manufacturing a substrate for an integrated circuit ("IC") card in which an IC module is embedded, and, in particular, to a method for manufacturing a substrate for an IC card formed by injection molding the IC card substrate to provide a recessed section for housing the IC module.

2. Description of the Relevant Art

In recent years, many types of membership cards, including cash cards and credit cards, and various types of other cards such as hospital consultation cards have proliferated. Such cards are progressively becoming an essential part of our daily lives. Currently, these cards are mainly magnetic cards, but there are limitations to the expansion of the functions of these magnetic cards because they contain small-volume memories. In addition, as is commonly known, cards on which a CPU, memory chip and the like are mounted have been appearing as multifunctional cards with a security function.

In a process for manufacturing conventional IC cards, an embedding hole for an IC module is provided by stamping, end-milling, drilling, and the like, at a specified position on a laminated PVC (polyvinyl chloride) or a PVCA (polyvinyl chloride acetate) sheet, and giving it a depth suitable for receiving an IC module containing a built-in IC device. Thereafter a laminating sheet for supporting the IC module is temporarily attached by laminating, the IC module is embedded in the embedding hole, and lastly a press-laminating method is applied on the sheet, or a spot-facing process is applied on a sheet of PVC or the like by end-milling so as to form an IC module housing recessed section in the sheet. However, with this process, a large volume of cuttings is produced, not only making it difficult to produce a high quality IC card, but also resulting in high costs. When an IC card produced from PVC or the like in this manner is burned, a noxious gas is produced, causing pollution and thus giving rise to various environmental problems and the like.

Accordingly, instead of using PVC, injection molding is carried out using low-polluting ABS (acrylnitrile/butadiene/styrene copolymerized resin). Such technology for producing IC cards at a low price is disclosed in Japanese Laid Open Patent Applications 64-56595 and 1-159295.

A summary of the injection molding technology disclosed in the above-mentioned Japanese Laid Open Patent Applications 64-56595 and 1-159295 is as follows. A substrate forming mold is made up of an upper mold and a lower mold, and a cavity of the same shape as an IC card substrate is formed inside the substrate forming mold. In addition, a projection for forming an IC module housing recessed section for the IC card substrate is provided on the lower mold. A gate for injecting the synthetic resin is also provided in the lower mold.

This injection molding technology will now be explained with reference to FIGS. 1 to 5. FIG. 1 is a sectional view of the principal parts showing the state where a synthetic resin has been injected into an IC card substrate forming mold. An IC card substrate forming mold 20 comprises an upper mold 21 and a lower mold 22. A cavity 23 of the same shape as an IC card substrate is formed at a so-called parting line (PL) 35 where the upper mold 21 and the lower mold 22 are positioned in opposition. In addition, a stepped projection 24 is provided for forming an IC module housing recessed section. A gate 25 for injecting synthetic resin is also positioned on the lower mold 22. A synthetic resin 26 such as ABS or the like is passed through the gate 25 from a liner 27 to fill the cavity 23, and is allowed to stand for a specified cooling period to form an IC card substrate as shown in FIG. 2.

However, the space (later-discussed residual body section 33) between the stepped projection 24 and the upper mold 21 is extremely narrow, and obstructs the flow of the synthetic resin 26. Generally, in injection molding it is practical to form a large number of units simultaneously. FIG. 2 is a plan view showing the formation of a large number of IC card substrates by injection molding. An IC module housing recessed section 29 in an IC card substrate 28 comprises a first stage substrate housing recessed section 30 and a second stage IC chip housing recessed section 31. In commonly known thin IC card substrates, the residual body section 33 of the IC chip housing recessed section 31 is extremely thin, and it is difficult to make each distance between a pot 32 and each of the IC module housing recessed sections 29 uniform when forming a large number of units of the IC card substrate 28.

In addition, as shown in FIG. 2 and FIG. 4, the above-described gate 25 is provided at a position on the short side of the IC card substrate 28; therefore the molecular orientation of the filled synthetic resin 26 is in the direction indicated by the arrow A.

However, the following types of problems occur in this conventional technology. The body thickness of the residual body section 33 of the IC module housing recessed section 29 of the IC card substrate 28 shown in FIGS. 1 to 5 is extremely thin, as described above. Accordingly, even in the case where one IC card substrate 28 is formed, the synthetic resin 26 is filled into the cavity 23 of the IC card substrate forming mold 20, passing through the gate 25 via the runner 27 from the pot 32, and the stepped projection 24 becomes an obstacle preventing the flow of the synthetic resin 26 because the spacing at the upper mold 21 is extremely narrow, and it is difficult for all of the synthetic resin 26 to flow into the residual body section 33. The filling of the resin is therefore unsatisfactory. FIG. 3 is a partially enlarged sectional view showing the synthetic resin 26 adjacent to the IC module housing recessed section 29 of the IC card substrate 28 in the mobile state. As shown in FIG. 3, the synthetic resin 26 filled by the application of high pressure finally flows into the residual body section 33, and an opposing section 34 of the resin, a so-called weld portion, is created so that the residual body section 33 is weakened. Even when the synthetic resin 26 temporarily flows as far as the residual body section 33, the shrinkage of the synthetic resin 26 changes as a result of the difference in body thickness so that the residual body section 33 of the formed IC card substrate 28 has a tendency to swell. As shown in FIG. 2, when a large number of IC card substrates are formed, as outlined above, the timing of the flow to the residual body section 33 of the IC module housing recessed section positioned in the respective IC card substrates 28 differs slightly for each cavity 23. It is therefore difficult for the synthetic resin 26 to flow uniformly up to the residual body section 33 of each IC card substrate 28. Even when the synthetic resin is filled using temporary application of an excessively high pressure, there is the problem that flashes appear on the PL surface 35. Furthermore, as shown in FIG. 4 and FIG. 5, the gate 25 is positioned on the short side of the IC card substrate 28; therefore the molecular orientation of the filled synthetic resin 26 is in the direction indicated by the arrow A, and there are various problems such as longitudinal breaking in the IC card bending tests set by the ISO.

SUMMARY OF THE INVENTION

An object of the present invention is to provide, with due consideration to the drawbacks of such conventional technology, a method for manufacturing large quantities of a low polluting, high quality IC card substrate at low cost.

This object is achieved in the present invention by the provision of a first mode of the present invention constituting a method for manufacturing a substrate for an IC card formed by injecting a synthetic resin into a cavity of a mold for molding an IC card substrate to create a recessed section for housing an IC module wherein the synthetic resin is filled into the cavity of the mold for molding an IC card substrate and a core pin for forming the recessed section is caused to project into the cavity as far as a specified position while the synthetic resin is in the mobile state to create the recessed section for housing an IC module.

The object of the present invention is further achieved by the provision of a second mode of the present invention constituting a method for manufacturing a substrate for an IC card formed by injecting a synthetic resin into a cavity of a mold for molding an IC card substrate to create a recessed section for housing an IC module, wherein a core pin for forming the recessed section in the cavity of the mold for molding an IC card substrate is caused to project to an intermediate position, the synthetic resin is filled into the mold, then the core pin for forming the recessed section is caused to project from the intermediate position up to a specified position while the synthetic resin is in the mobile state, to create a recessed section of the desired depth for housing an IC module.

The object of the present invention is further achieved by the provision of a method for manufacturing a substrate for an IC card according to the first and second modes wherein the IC module housing indentation comprises a first stage substrate housing recessed section and a second stage IC chip housing recessed section, and only the second stage IC chip housing indentation is formed by the projection of the core pin to create the recessed section.

A method for manufacturing a substrate for an IC card according to the first and second modes is provided, wherein the IC module housing indentation comprises a first stage substrate housing recessed section and a second stage IC chip housing recessed section, and the two recessed sections are formed by causing the projection of the core pin to create the recessed section.

In addition, a method for manufacturing a substrate for an IC card is provided by the present invention wherein a gate on the IC card substrate forming mold is positioned away from the center on the long side of the rectangular IC card substrate, opposite the IC module housing recessed section.

Further, a method for manufacturing a substrate for an IC card is provided by the present invention wherein the gate position of the IC card substrate forming mold is almost in agreement with the IC module housing recessed section.

A method for manufacturing a substrate for an IC card is also provided wherein the IC module housing recessed section is offset in either direction from the center of the short side of the rectangular IC card substrate, and the gate on the IC card substrate forming mold is positioned on the long side of the rectangular IC card substrate, opposite the IC module housing recessed section.

A method for manufacturing a substrate for an IC card is also provided wherein the surface of the end of the core pin for forming the recessed section arranged inside the IC card substrate forming mold is spherical.

A method for manufacturing a substrate for an IC card is also provided wherein the inside of the cavity of the IC card substrate forming mold is formed so that the width and thickness of the IC card substrate gradually increase in size the further they are from the gate position on the long side of the rectangle.

Accordingly, in the method for manufacturing a substrate for an IC card of the present invention, the core pin for forming a recess of a shape suitable for the IC module housing recessed section is caused to project, after the synthetic resin is filled into the cavity of the IC card substrate forming mold without any hindrance, for injection molding of the IC card substrate. The synthetic resin flows smoothly and reliably, so that it is possible to precisely form the residual body section of the IC module housing recessed section. In addition, when a large number of units are formed, this has no relation to the timing of the filling of the residual body section; therefore the positioning of the IC module housing recessed section can be freely set without being restricted by the respective cavities. In addition, because the gate on the IC card substrate forming mold is positioned on the long side of the IC card substrate opposite the IC module housing recessed section, and, further, because the position of the gate is almost in line with the IC module housing recessed section on the side away from the IC module housing recessed section along the short side of the IC card substrate, the molecular orientation of the synthetic resin is in almost the diagonal direction of the IC card substrate; therefore the bending strength is improved. Further, because the surface of the end of the core pin for forming the recessed section is spherical, the strength of the residual body section of the IC chip housing recessed section is augmented. In addition, the inside of the cavity of the IC card substrate forming mold is formed so that the width and thickness of the IC card substrate gradually increase in size the further they are from the gate position on the long side of the rectangle; therefore a formed product of uniformly high precision in width and thickness is obtained in consideration of the difference in shrinkage of the resin from the gate position.

The above and many other advantages, features, and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

An embodiment of the present invention will now be explained with reference to the drawings (FIGS. 6A to 13).

Figure 1:
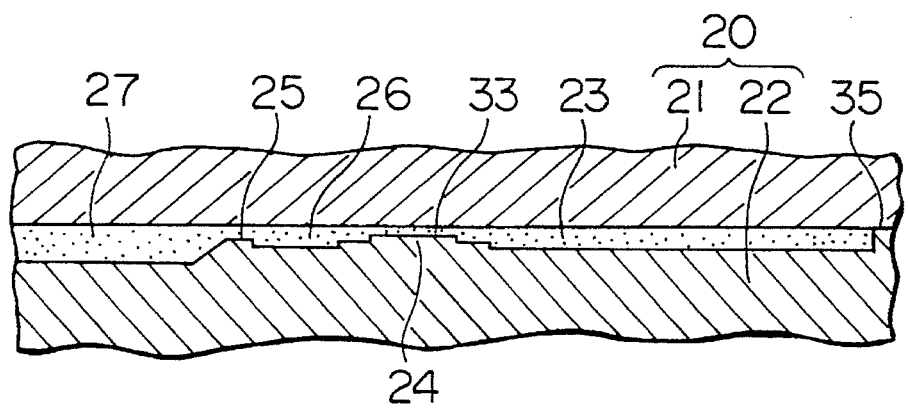
FIG. 1 is a general sectional view showing the principal parts of a conventional IC card substrate forming mold.
Figure 2:
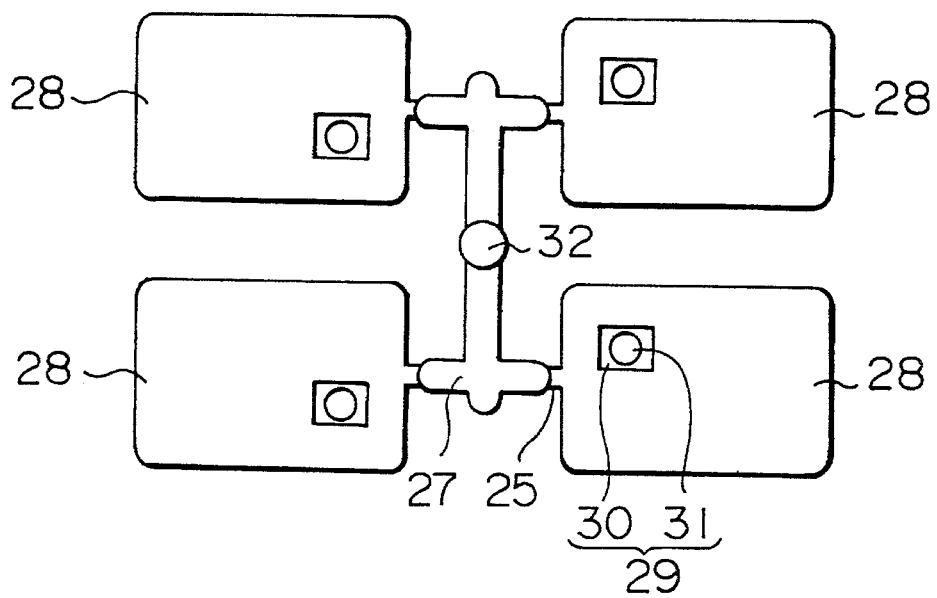
FIG. 2 is an approximate plan view showing the formation of a large number of IC card substrates using a conventional injection molding method.
Figure 3:
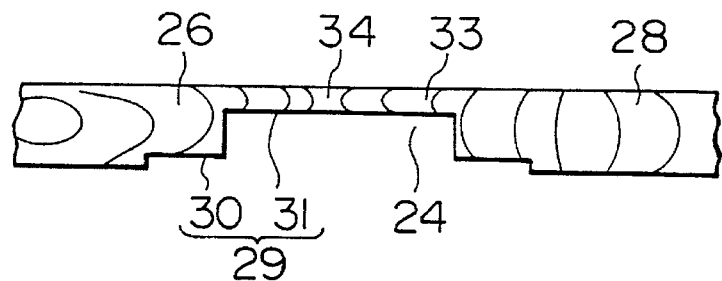
FIG. 3 is a partially enlarged sectional view showing the mobile state of a resin adjacent to an IC module housing recessed section for an IC card substrate in conventional technology.
Figure 4:
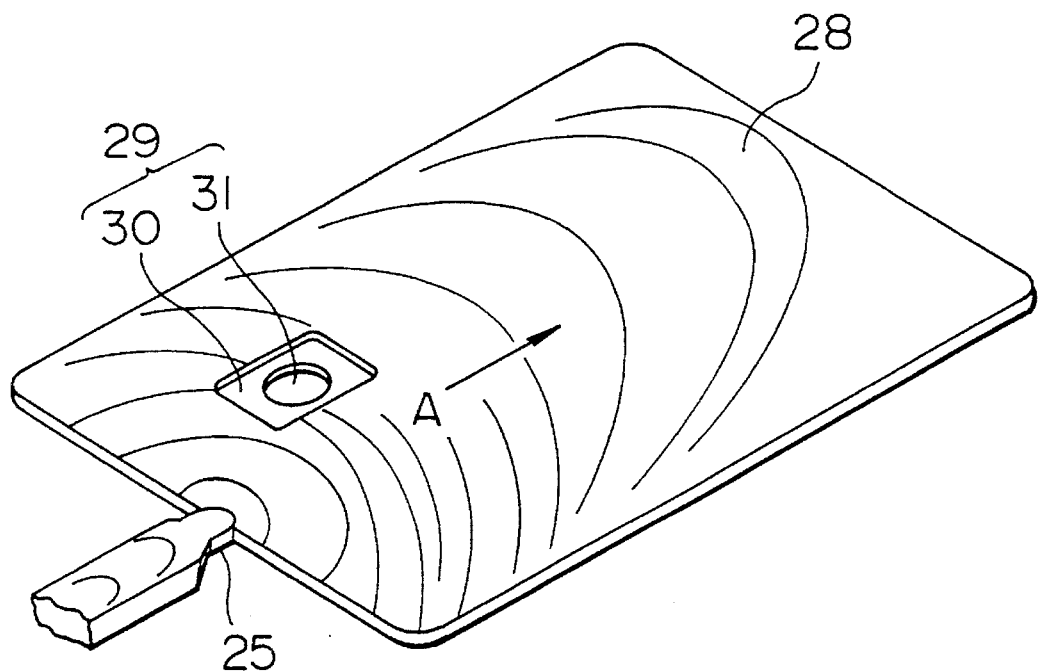
FIG. 4 is a perspective view showing a gate position and the molecular orientation for an IC card substrate manufactured using conventional technology.
Figure 5:
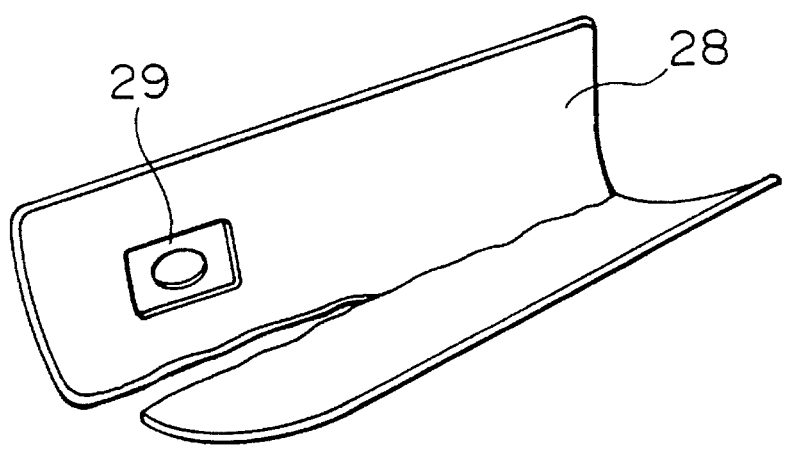
FIG. 5 is a perspective view showing bending test conditions for an IC card substrate manufactured using conventional technology.
Figure 6A:
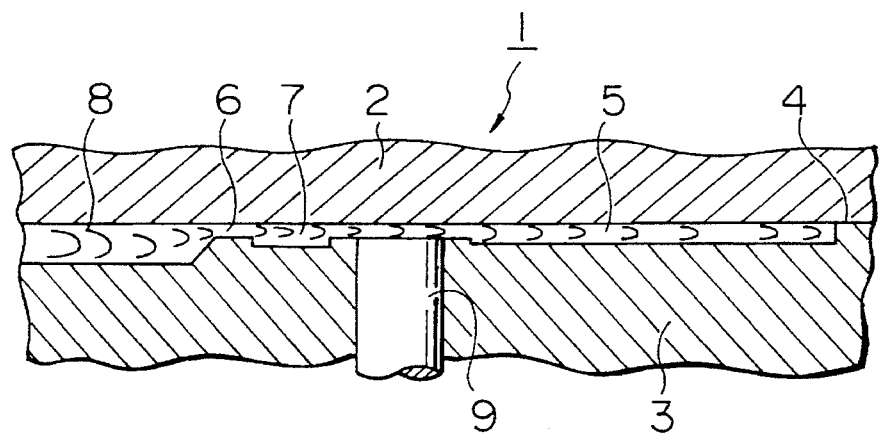
FIGS. 6A and 6B are general sectional views showing the principal parts of an IC card substrate forming mold used in a first embodiment of the method of the present invention.
Figure 6B:
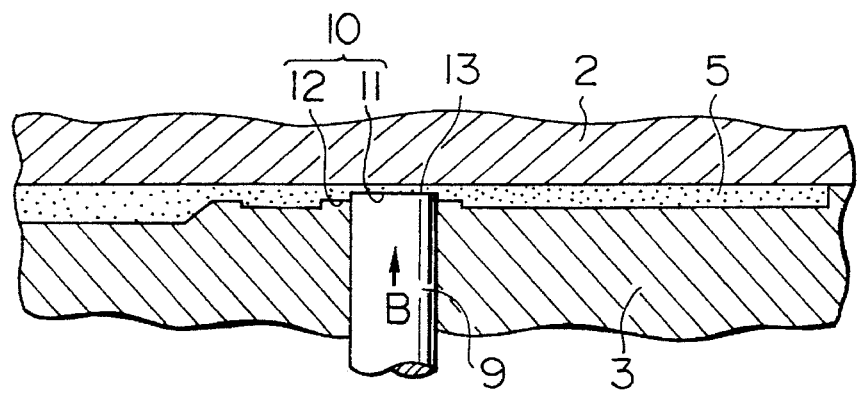
Figure 7:
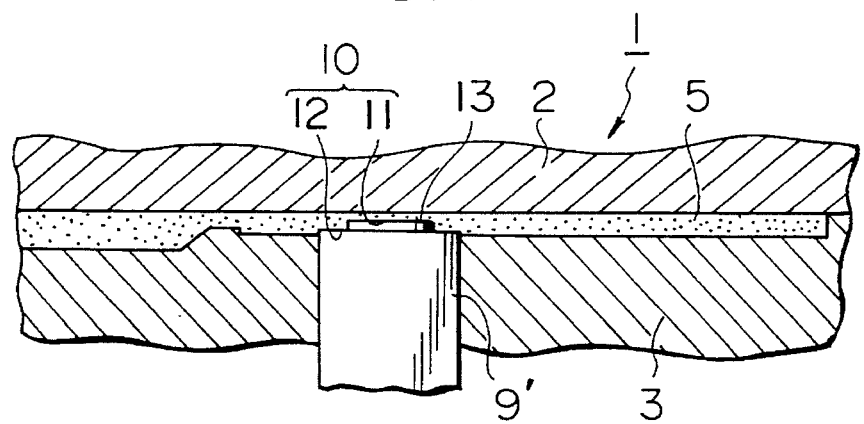
FIG. 7 is a general sectional view showing the principal parts of an IC card substrate forming mold used in a second embodiment of the method of the present invention.

FIGS. 6A and 6B are general sectional views showing the principal parts of an IC card substrate forming mold used in a first embodiment of the present invention. FIG. 6A shows the state during the filling of a synthetic resin, and FIG. 6B shows the state in which a core pin for forming an IC module housing recessed section is caused to project while the filled synthetic resin is in the mobile state. FIGS. 6A and 6B show an IC card substrate forming mold 1 comprising an upper mold 2 and a lower mold 3. A cavity 5 with the same shape as an IC card substrate is formed where the upper mold 2 and the lower mold 3 are in opposition at a parting line (PL) 4. In addition, a gate 6 for injecting the resin is positioned on the lower mold 3, and a synthetic resin 7 such as ABS or the like is filled smoothly into the cavity 5, passing through the gate 6 from a runner 8 without any difficulties. In the lower mold 3 of the IC card substrate forming mold 1, a recessed section forming core pin 9 for forming an IC chip housing recessed section 11 is arranged at a position corresponding to an IC module housing recessed section so that it does not obstruct the flow of the synthetic resin 7, and then is maintained in that position. Next, after the filling of the synthetic resin 7 is completed and the synthetic resin 7 is still in the mobile, unsolidified state, the recessed section forming core pin 9 is caused to project to a specified position in the direction of the arrow B, and an IC chip housing recessed section 11 which forms an IC module housing recessed section 10 is reliably formed by compression. The mold is allowed to stand for a specified cooling period so that an IC card substrate is formed. Further, a substrate housing recessed section 12 is formed within the IC module housing recessed section 10 by means of a projection previously formed in a section of the lower mold 3 corresponding thereto.

Accordingly, as outlined above, an extremely thin residual body section 13 is precisely and evenly formed by compression from the recessed section forming core pin 9, avoiding any unsatisfactory filling of the resin. When a large number of IC card substrates are formed, the IC chip housing recessed section 11 is formed irrespective of the timing at which the synthetic resin 7 is filled into each of the cavities 5. In addition, the position of the IC module housing recessed section 10 can also be freely set, which is ideal for multi-unit fabrication.

In the above-described first embodiment only the IC chip housing recessed section 11 is formed in the IC module housing recessed section 10 by the projection of the recessed section forming core pin 9. However, with a second embodiment of the present invention shown in FIG. 7, it is possible to form both the IC chip housing recessed section 11 and the substrate housing recessed section 12 by causing a stepped recessed section forming core pin 9' to be projected.

Figure 8:
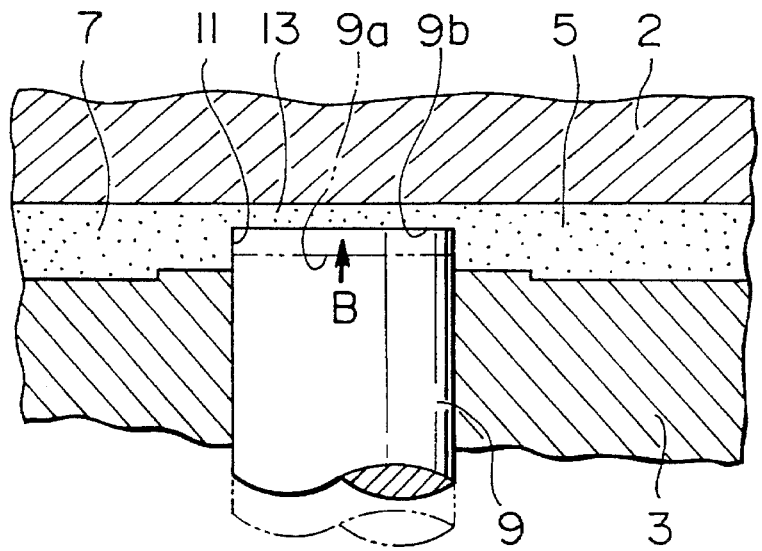
FIG. 8 is a partially enlarged sectional view of an IC card substrate forming mold used in a third embodiment of the method of the present invention.

FIG. 8 shows a third embodiment of the present invention. The synthetic resin 7 is filled in a state in which the recessed section forming core pin 9 is caused to project into the cavity 5 of the IC card substrate forming mold 1 to a degree which does not obstruct the flow of the synthetic resin 7 during filling, to an intermediate position 9a, shown in the drawing by a dotted line. Subsequently, while the synthetic resin 7 is still in the mobile, unsolidified state, the recessed section forming core pin 9 is caused to project from the intermediate position 9a in the direction of the arrow B to a specified final position 9b, then the IC chip housing recessed section 11 is formed by compression and allowed to stand for a specified cooling period. In this embodiment, for each degree of reduction of the amount by which the recessed section forming core pin 9 is advanced, the residual body section 13 of the IC chip housing recessed section 11 is more precisely formed.

Figure 9:
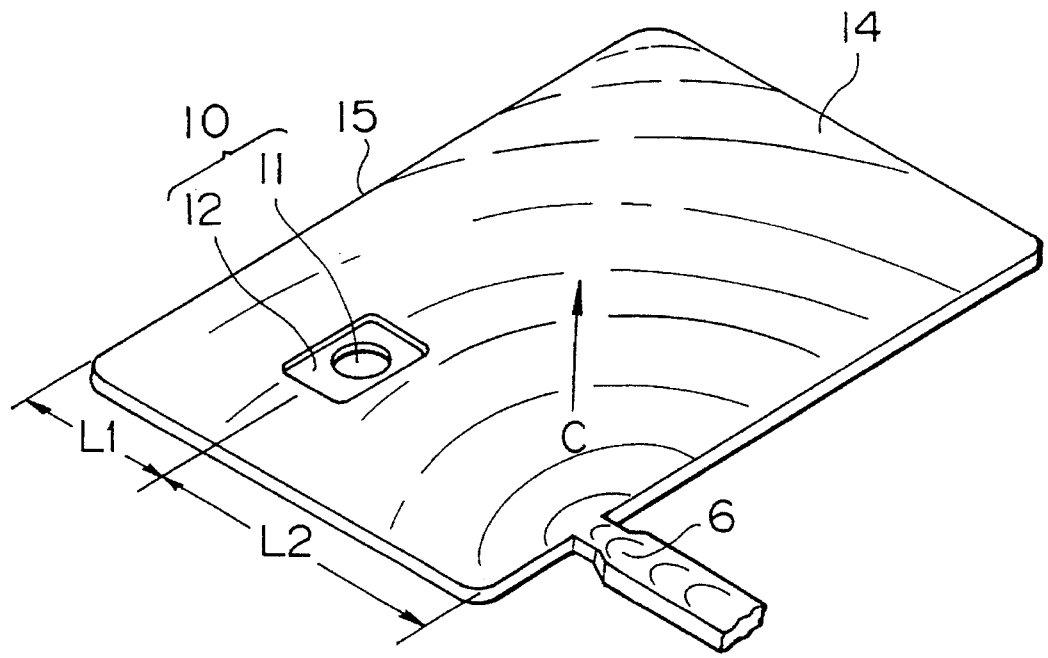
FIG. 9 is a perspective view showing a gate position and the molecular orientation for an IC card substrate manufactured using the method of the present invention.
Figure 10:
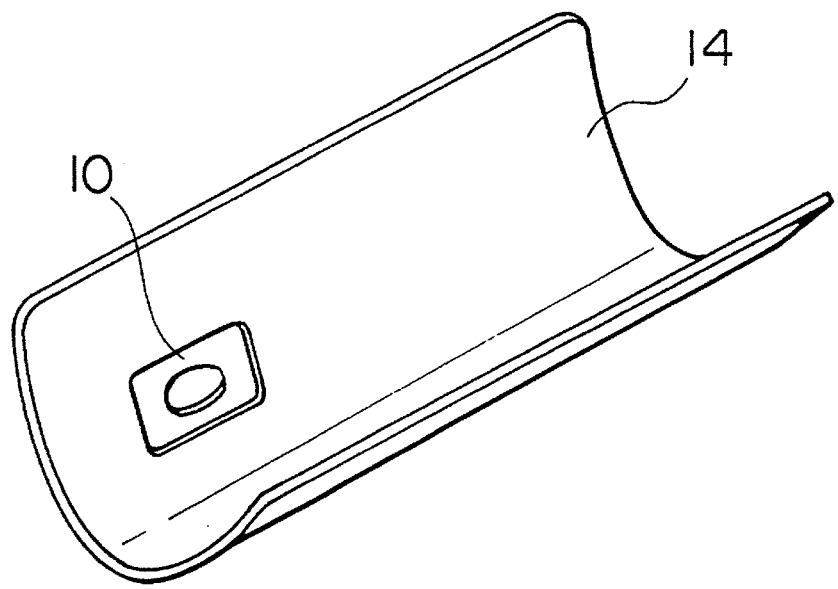
FIG. 10 is a perspective view showing bending test conditions for an IC card substrate manufactured using the method of the present invention.

Next, FIG. 9 is a perspective view showing the position of a gate 6 for an IC card substrate 14 formed by injection molding in the present invention. The gate 6 on the IC card substrate forming mold 1 is positioned away from the center on the long side of the rectangular IC card substrate 14, opposite the IC module housing recessed section 10. Further, the position of the gate 6 is almost in line with the IC module housing recessed section 10, on the side away from the IC module housing recessed section 10 along the short side of the IC card substrate 14. Specifically, with L1<L2 on the short side in FIG. 9, the gate 6 is placed at the L2 side on the long side.

As described in the foregoing, by placing the gate 6 on the IC card substrate forming mold 1 on the long side of the IC card substrate 14 on the side away from the IC module housing recessed section 10 along the short side at a position almost in line with the IC module housing recessed section 10, the molecular alignment of the synthetic resin 7 is in the direction of the arrow C as shown in FIG. 9, specifically, in the almost diagonal direction. Therefore, there is no breakage during the card bending test stipulated by the ISO (International Organization for Standardization) illustrated in FIG. 10, and the bending strength is remarkably improved. Also, as shown in FIG. 9, with the IC card substrate 14, the long side opposite the position of the card 6 is normally used as a standard surface 15 for determining the position of the IC module housing recessed section 10 stipulated by the ISO. This standard surface 15 is used for positioning when the card is put into a read/write apparatus; therefore, it is obvious that the gate 6 should not be positioned on the standard surface 15.

Figure 11:
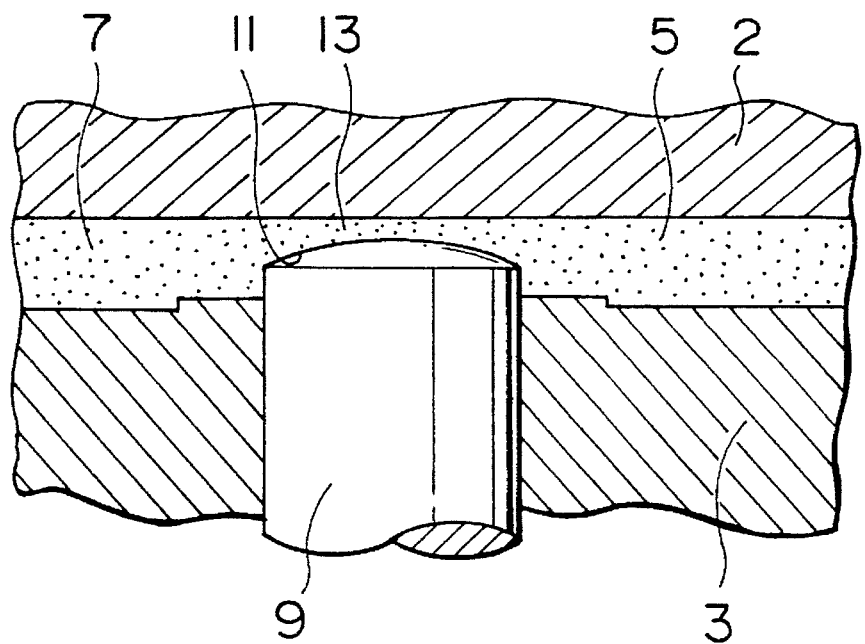
FIG. 11 is a partially enlarged sectional view of an IC card substrate forming mold used in a fourth embodiment of the method of the present invention.

As a fourth embodiment shown in FIG. 11, the surface of the end of the recessed section forming core pin 9 positioned in the IC card substrate forming mold 1 is convex. As commonly known, in the case where the sealed section of the IC module is formed by potting, the sealed section of the IC module becomes spherical. Accordingly, when the surface of the end of the recessed section forming core pin 9 is convex and the IC chip housing recessed section 11 is formed, the base section of the IC chip housing recessed section 11 is shaped like a bowl. It is also advantageous if the periphery of the base section has a thick body, therefore making it possible to augment the strength of the extremely thin residual body section 13. Also, when the end surface of the recessed section forming core pin 9 is convex, this shape is ideal in promoting the flow of the synthetic resin during compression molding and for promoting the life expectancy of the recessed section forming core pin 9.

Figure 12:
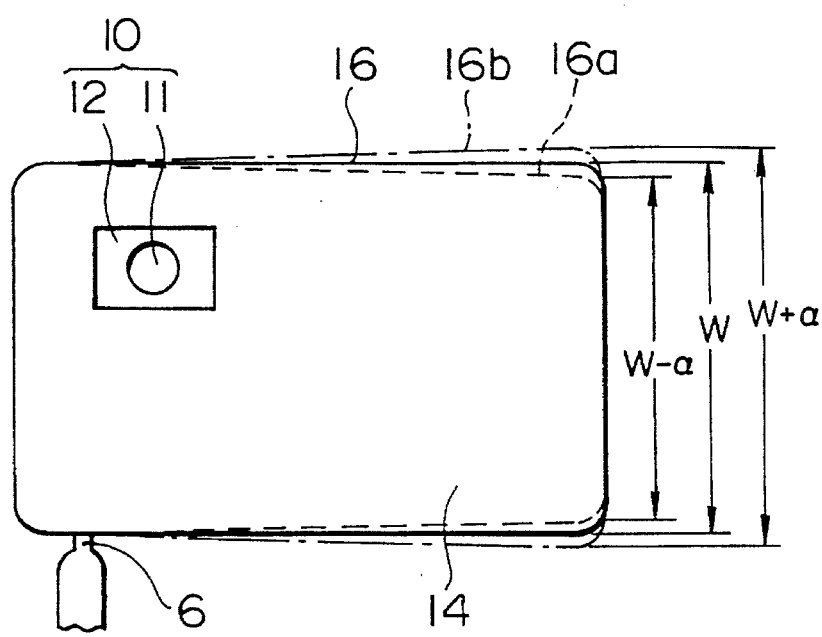
FIG. 12 is a plan view of an IC card substrate relating to a fifth embodiment of the method of the present invention.
Figure 13:
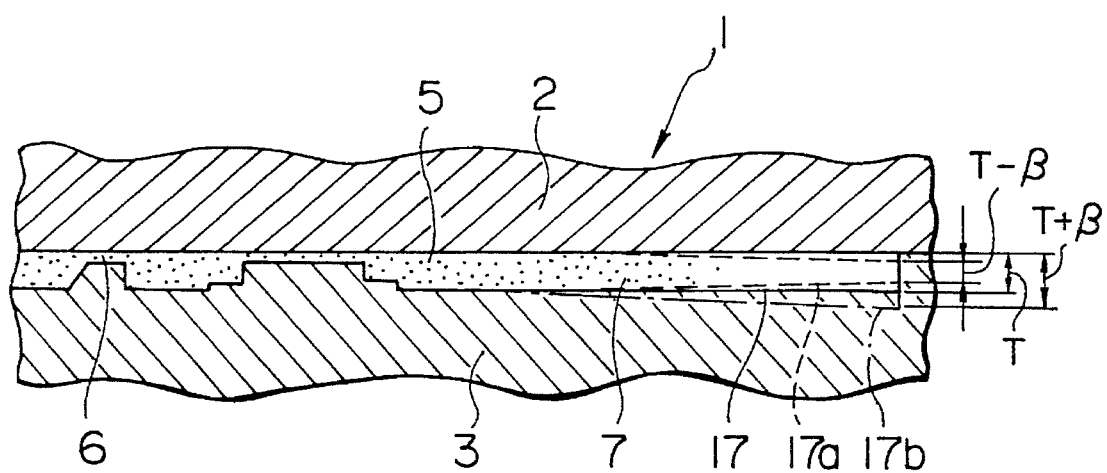
FIG. 13 is a sectional view of the principal parts of the forming mold for manufacturing the IC card substrate shown in FIG. 12.

FIGS. 12 and 13 show a fifth embodiment of the present invention. As outlined above, by placing the gate on the long side of the IC card substrate 14 at a position almost in line with the IC module housing recessed section 10 on the side away from the IC module housing recessed section 10 along the short side, the filling pressure of the synthetic resin is high in the vicinity of the gate 6 and decreases according to the distance from the position of the gate at the long side of the IC card substrate 14. Accordingly, the filling density of the resin is also high in the vicinity of the gate 6, and decreases according to the distance from the position of the gate at the long side of the IC card substrate 14. Generally, in the injection molding of ABS resin the formed product shrinks, as is commonly known, and, as previously outlined, disparities are produced in the shrinkage of the resin because of the change in filling density of the resin inside the IC card substrate 14. As shown in FIG. 12, the proper shape of the IC card substrate 14 in the plane direction is shown by a solid line 16, and the width W gradually narrows to α (about 0.05 mm) at the end on the long side as shown by the dotted line 16a. On the other hand, as shown in FIG. 13, the proper shape of the IC card substrate 14 in the thickness direction is given by a solid line 17, and the thickness T gradually decreases to β (about 0.04 mm) at the end on the long side as shown by the dotted line 17a. In this manner, the width and thickness of the formed product become non-uniform. Accordingly, when the molded IC card substrate 14 is inserted into a read/write apparatus, an inconvenience occurs whereby the IC card substrate is set at an angle to the read/write apparatus and the matching position of the contact point of the side of the read/write apparatus is offset with respect to the contact. Therefore, to compensate for the shrinkage of the resin, the dimensions of the inside of the cavity 5 of the IC card substrate forming mold 1 are set in advance as shown by the dotted lines 16b and 17b in FIGS. 12 and 13, and the dimensions of the inside of the cavity 5 of the IC card substrate forming mold 1. Also, in consideration of the shrinkage of the resin, the width W and the thickness T at the end of the long side are set so that they respectively become gradually larger according to the distance from the position of the gate on the long side of the IC card substrate 14. The IC card substrate 14 is therefore formed with uniform width and thickness with good precision.

Accordingly, to achieve the special features of the present invention as outlined in the foregoing, when the IC module housing recessed section in the IC card substrate is formed by injection molding, after ABS resin is filled into the cavity in the IC card substrate forming mold, the core pin for forming the recessed section is caused to project into the cavity while the synthetic resin is in the mobile state, to create the recessed section for housing an IC module. In particular, the method of the present invention overcomes the conventional problems and is suitable for forming a large number of IC card substrates while avoiding unsatisfactory filling of the resin in the residual body section where the IC module housing recessed section is extremely thin. The timing of the filling of the residual body section is also not a problem. Also, by placing the gate on the IC card substrate forming mold on the long side of the IC card substrate at a position almost in line with the IC module housing recessed section on the side away from the IC module housing recessed section along the short side, the molecular alignment of the synthetic resin is in the almost diagonal direction, and the bending strength is therefore remarkably improved. In addition, because the surface of the end of the core pin for forming the recessed section is spherical, the strength of the residual body section can be augmented. Further, it is possible to obtain a molded product in which both the width and thickness have a uniformly high precision because the shape and dimensions of the inside of the cavity in the IC card substrate forming mold can be set in advance in consideration of disparities in the shrinkage of the resin, resulting from fluctuations of the filling density of the resin because of the gate position.

Expressing this specifically in mathematical terms, the smallest body thickness of the IC module housing recessed section is limited to 220 μm in the manufacturing method of the conventional technology. When an attempt is made to manufacture a thinner product a hole occurs. However, it is possible to have a body with this part as thin as 100 μm by using the manufacturing method of the present invention, and it is possible to make only this part of the IC module thick.

As explained above, during the filling of the synthetic resin there is no narrow obstruction section corresponding to the IC chip housing recessed section when forming the IC card substrate with an IC module housing recessed section by injection molding, using the method of the present invention. The resin therefore flows smoothly and reliably into the cavity of the IC card substrate forming mold, and the recessed section forming core pin is advanced as far as a specified position during the mobile state prior to the hardening of the resin; therefore unsatisfactory filling of the resin for the residual body section where the IC module housing recessed section is extremely thin does not occur, so that the strength of the residual body section is augmented. In addition, forming a large number of IC card substrates is simple. Also, as outlined above, by placing the gate on the IC card substrate forming mold on the long side of the IC card substrate at a position almost in line with the IC module housing recessed section on the side away from the IC module housing recessed section along the short side, the molecular alignment of the filled synthetic resin is in the almost diagonal direction, therefore, the bending strength is improved. In addition, because the surface of the end of the core pin for forming the recessed section is spherical, the strength of the residual body section can be augmented. Further, because the shape of the inside of the cavity in the IC card substrate forming mold can have its dimensions set in advance in consideration of disparities in the shrinkage of the resin, resulting from fluctuations of the filling density of the resin because of the gate position, it is possible to manufacture an IC card substrate suitable for high quality, low cost, large volume production of a low polluting molded product in which both the width and thickness have a uniformly high precision.

What is claimed is:

1. A method of making an IC card substrate having a thickness, opposing faces separated by the thickness and a recess in one of the faces for receiving an IC module, the recess having a depth, the method comprising the steps of providing a mold having a cavity for molding the substrate, positioning a reciprocable core pin in the mold on a side thereof which faces the one face and so that the pin overlies the recess; injecting a fluid, hardenable material into the cavity; before terminating the injecting step initially moving the core pin towards the cavity so that a free end thereof extends less than the depth of the recess into the cavity; thereafter completing the injecting step; further moving the core pin into the cavity so that its free end extends into the cavity to a depth which equals the depth of the recess; and thereafter hardening the fluid material.

2. A method according to claim 1 wherein the step of initially moving is performed prior to a commencement of the injection step.

3. A method according to claim 1 wherein the initially moving step is performed after a commencement of the injecting step.

4. A method according to claim 1 wherein the step of further moving the core pin comprises further moving the core pin into the cavity so that its free end is spaced no more than about 100 μm from the other face of the substrate.

5. A method of making an IC card substrate of ABS plastic material, the substrate including oppositely oriented faces spaced apart by a thickness of the substrate, an IC module receiving recess in one of the faces and an IC chip recessed section within the recess extending towards the other one of the faces and forming a recess section bottom surface spaced from the other one of the faces by no more than about 100 μm, the method comprising the steps of providing a mold having a cavity for molding the substrate, providing a reciprocable core pin in the mold having a cross-section corresponding to a cross-section of the recessed section and in alignment with the recessed section; partially advancing the core pin into the cavity so that a free end of the core pin is spaced from the other face a distance greater than 100 μm; injecting the ABS material in its fluid state into the cavity and filling the cavity therewith; thereafter further moving the core pin into the cavity until its free end is spaced from the other face of the substrate no more than about 100 μm; and hardening the ABS material.

6. A method according to claim 5 wherein the substrate has a substantially rectangular outline, the recess being offset with respect to perpendicular long and short center lines of the substrate, wherein the step of providing comprises providing a mold having a cavity including long and short sides corresponding to edges of the rectangular substrate; and wherein the ABS material is injected through a port located along a long side of the cavity and relatively proximate to one of the short sides of the cavity.

7. A method according to claim 6 wherein the step of injecting is performed along a long side of the cavity which is spaced further from the recess than another long side of the cavity.

8. A method according to claim 7 wherein a spacing between short sides of the cavity and the recess is approximately the same as a spacing between the short sides and the port.

9. A method according to claim 6 including the step of diverging surfaces of the cavity which define the faces of the substrate in a longitudinal direction of the rectangular cavity from the port towards a short side of the cavity furthest spaced from the port.

10. A method according to claim 6 including the step of diverging the long sides of the cavity from the port towards a short side of the cavity furthest spaced from the port.

11. A method of making a substrate for a substantially rectangular IC card having opposing faces spaced apart by a thickness of the card, a pair of spaced-apart, longitudinal edges and a pair of spaced-apart, short edges, and a recess for an IC chip, the method comprising the steps of providing a mold having a cavity conforming in size to the substrate and defining correspondingly long and short cavity sides which intersect at cavity corners; providing a reciprocable core pin in the mold a free end of which is extendable into the cavity; injecting a fluid, hardenable plastic material into the cavity; in the cavity flowing the injected material generally diagonally from an edge of the cavity proximate one of the cavity corners in a generally diagonal direction towards a diagonally opposite corner of the cavity to thereby molecularly align the fluid plastic material in the diagonal direction; prior to completely filling the cavity with the plastic material advancing the core pin into the cavity so that the free end of the core pin extends into the cavity a distance less than a desired depth of the recess; thereafter sequentially completing the injection step, further advancing the core pin into the cavity to the desired recess depth and hardening the plastic material; whereby a molecular alignment of the plastic material in the diagonal direction strengthens the substrate and prevents its breakage when bent about an axis of the substrate.

12. A method according to claim 11 including the steps of injecting the plastic material into the cavity at a point of injection proximate a cavity corner, and diverging at least one of the longitudinal edges of the cavity and surfaces of the cavity defining the substrate faces from a point of injection of the plastic material in a longitudinal direction of the card.

* * * * *